(12) United States Patent
Yamaguchi

(10) Patent No.: US 10,819,085 B2
(45) Date of Patent: Oct. 27, 2020

(54) METHOD FOR MANUFACTURING OPTICAL SEMICONDUCTOR DEVICE

(71) Applicant: Mitsubishi Electric Corporation, Tokyo (JP)

(72) Inventor: Tsutomu Yamaguchi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/349,119

(22) PCT Filed: Aug. 23, 2017

(86) PCT No.: PCT/JP2017/030175
§ 371 (c)(1),
(2) Date: May 10, 2019

(87) PCT Pub. No.: WO2018/109982
PCT Pub. Date: Jun. 21, 2018

(65) Prior Publication Data
US 2019/0296523 A1 Sep. 26, 2019

(30) Foreign Application Priority Data
Dec. 14, 2016 (WO) .................. PCT/JP2016/087174

(51) Int. Cl.
*H01S 5/22* (2006.01)
*H01S 5/12* (2006.01)
(Continued)

(52) U.S. Cl.
CPC .................. *H01S 5/22* (2013.01); *H01S 5/12* (2013.01); *H01S 5/3013* (2013.01); *H01S 5/0421* (2013.01)

(58) Field of Classification Search
CPC . H01S 5/22; H01S 5/12; H01S 5/1064; H01S 2301/176; G02B 2006/12097; H01L 21/28587
See application file for complete search history.

(56) References Cited

U.S. PATENT DOCUMENTS

| 5,029,175 A | 7/1991 | Ohnaka et al. |
| 5,851,849 A | 12/1998 | Comizzoli et al. |

(Continued)

FOREIGN PATENT DOCUMENTS

| JP | H02-156588 A | 6/1990 |
| JP | 2012-009488 A | 1/2012 |

(Continued)

OTHER PUBLICATIONS

International Search Report; Written Opinion; and Notification of Transmittal of the International Search Report and the Written Opinion of the International Searching Authority, or the Declaration issued in PCT/JP2017/030175; dated Sep. 19, 2017.

(Continued)

*Primary Examiner* — Alia Sabur
(74) *Attorney, Agent, or Firm* — Studebaker & Brackett PC

(57) ABSTRACT

A ridge structure (9) having a ridge lower part (6), a ridge upper part (8) above the ridge lower part (6) and having a larger width than the ridge lower part (6), is formed on a semiconductor substrate (1). A recess (11) of the ridge structure (9), where the ridge lower part (6) is laterally set back from the ridge upper part (8) due to a difference in width between the ridge upper part (8) and the ridge lower part t (6), is completely filled with an insulating film (10) by an atomic layer deposition method to form a protrusion (19)

(Continued)

from the semiconductor substrate (1), the ridge structure (9), and the insulating film (10) without any step in a side face of the protrusion (19).

20 Claims, 9 Drawing Sheets

(51) Int. Cl.
*H01S 5/30* (2006.01)
*H01S 5/042* (2006.01)

(56) References Cited

U.S. PATENT DOCUMENTS

| | | | |
|---|---|---|---|
| 6,200,826 B1* | 3/2001 | Kim | ............ H01S 5/22 438/31 |
| 8,780,949 B2 | 7/2014 | Takagi | |
| 2005/0070113 A1* | 3/2005 | Hanberg | ............ H01L 21/28587 438/706 |
| 2010/0006983 A1 | 1/2010 | Gutsche et al. | |
| 2014/0264274 A1 | 9/2014 | Nakayama et al. | |
| 2017/0294339 A1* | 10/2017 | Tapily | ............... H01L 21/02164 |

FOREIGN PATENT DOCUMENTS

| | | |
|---|---|---|
| JP | 2014-007295 A | 1/2014 |
| JP | 5454381 B2 | 3/2014 |
| JP | 2014-179389 A | 9/2014 |

OTHER PUBLICATIONS

Office Action issued in JP 2017-507888; issued by the Japanese Patent Office dated Mar. 21, 2017.
Office Action issued in JP 2017-507888; mailed by the Japanese Patent Office dated May 30, 2017.
Office Action issued in JP 2017-552513; mailed by the Japanese Patent Office dated Nov. 14, 2017.
An Office Action issued by the State Intellectual Property Office of the People's Republic of China on May 26, 2020, which corresponds to Chinese Patent Application No. 201780076049.7 and is related to U.S. Appl. No. 16/349,119 with English language translation.

* cited by examiner

METHOD FOR MANUFACTURING OPTICAL SEMICONDUCTOR DEVICE

FIELD

The present invention relates to a method for manufacturing an optical semiconductor device by wherein recesses in a ridge structure is filled with an insulating film.

BACKGROUND

For semiconductor lasers having a ridge structure, it is necessary to secure enough area for a ridge upper part in order to reduce resistance, as well as to reduce the width of a ridge lower part in order to achieve high-speed response. The ridge structure therefore commonly has a reverse mesa ridge structure, a T-shape structure, or a Y-shape structure. Further, a method for realizing ridge dimensions whereby a device structure designed for achieving high-speed response is made stable has been disclosed (see, for example, PTL 1).

CITATION LIST

Patent Literature

[PTL 1] Japanese Patent No. 5454381

SUMMARY

Technical Problem

In a reverse mesa ridge structure, a T-shape structure, or a Y-shape structure, there are recesses where the ridge lower part is laterally set back from the ridge upper part. With the conventional practice of using a sputtering or plasma CVD method for deposition of an insulating film, coverage with the insulating film was not sufficient, thus the recesses in the ridge structure could not be fully filled with the insulating film. The consequent problem was that the ridge structure was susceptible to changes in the external environment such as temperature, aging, and mechanical stress applied during assembly.

The present invention was made to solve the problem described above and it is an object of the invention to provide a method for manufacturing an optical semiconductor device whereby the mechanical strength of the ridge structure can be enhanced.

Solution to Problem

A method for manufacturing an optical semiconductor device according to the present invention includes: forming a ridge structure having a ridge lower part, a ridge upper part above the ridge lower part and having a larger width than the ridge lower part, on a semiconductor substrate; and completely filling a recess of the ridge structure, where the ridge lower part is laterally set back from the ridge upper part due to a difference in width between the ridge upper part and the ridge lower part, with an insulating film by an atomic layer deposition method to form a protrusion from the semiconductor substrate, the ridge structure, and the insulating film without any step in a side face of the protrusion.

Advantageous Effects of Invention

In the present invention, a recess of the ridge structure, where the ridge lower part is laterally set back from the ridge upper part, is completely filled with an insulating film by an atomic layer deposition method. Therefore, the mechanical strength of the ridge structure can be enhanced.

DESCRIPTION OF EMBODIMENTS

A method for manufacturing an optical semiconductor device according to the embodiments of the present invention will be described with reference to the drawings. The same components will be denoted by the same symbols, and the repeated description thereof may be omitted.

Embodiment 1

Figure 1:
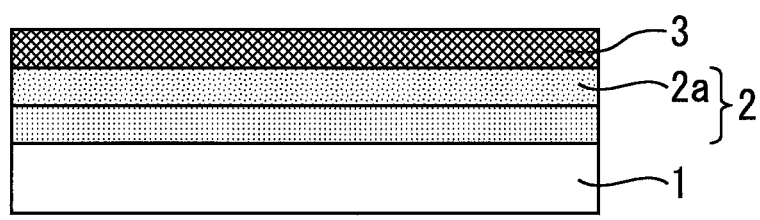
FIG. 1 is a cross-sectional view illustrating a method for manufacturing an optical semiconductor device according to Embodiment 1 of the present invention.

FIG. 1 to FIG. 7 are cross-sectional views illustrating a method for manufacturing an optical semiconductor device according to Embodiment 1 of the present invention. First, as shown in FIG. 1, an active layer 2 is formed on a semiconductor substrate 1. An outermost surface layer 2a of the active layer 2 is an InP layer. A sacrifice layer 3 made of a different material from that of the outermost surface layer 2a of the active layer 2 is formed on the active layer 2. The sacrifice layer 3 is required to have an etching selectivity to InP, and may be an InGaAsP layer, for example. A thin InP layer may be formed on the InGaAsP layer as a cap layer. The thickness of the sacrifice layer 3 equals to the height of a ridge lower part to be described later.

Figure 2:
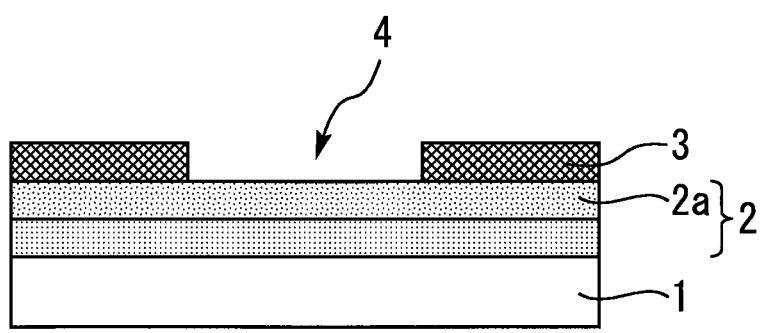
FIG. 2 is a cross-sectional view illustrating a method for manufacturing an optical semiconductor device according to Embodiment 1 of the present invention.
Figure 3:
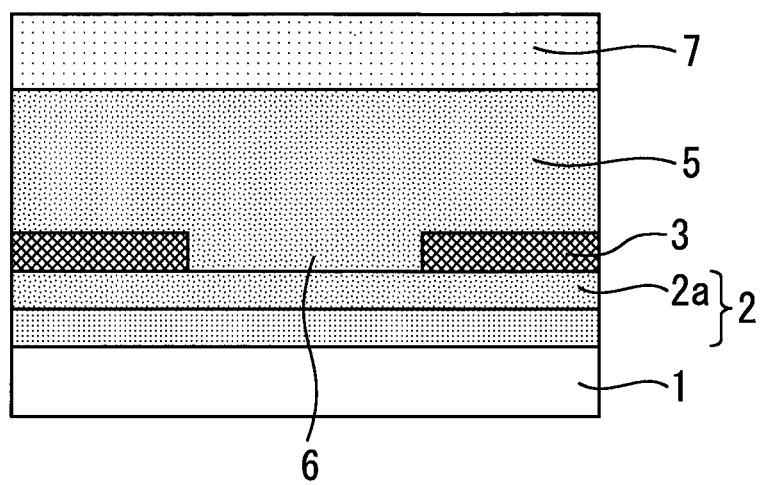
FIG. 3 is a cross-sectional view illustrating a method for manufacturing an optical semiconductor device according to Embodiment 1 of the present invention.

Next, as shown in FIG. 2, part of the sacrifice layer 3 is removed by wet etching or dry etching to form an aperture 4. Next, as shown in FIG. 3, an InP layer 5 made of a different material from that of the sacrifice layer 3 is formed on the active layer 2 and the sacrifice layer 3 to form a ridge lower part 6 inside the aperture 4. An InGaAs contact layer 7 is then formed on the InP layer 5. A thin InP layer may be formed on the InGaAs contact layer 7 as a cap layer.

Figure 4:
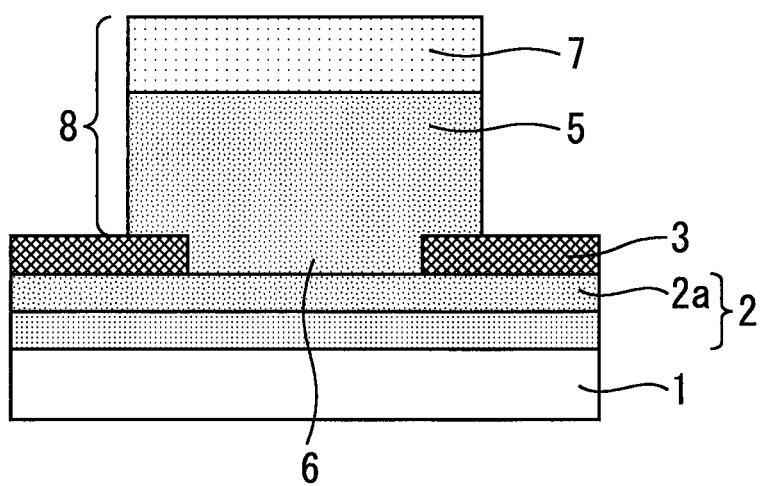
FIG. 4 is a cross-sectional view illustrating a method for manufacturing an optical semiconductor device according to Embodiment 1 of the present invention.
Figure 5:
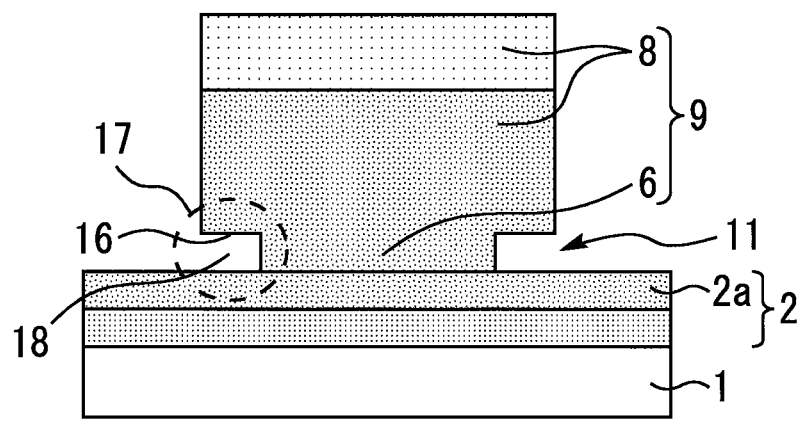
FIG. 5 is a cross-sectional view illustrating a method for manufacturing an optical semiconductor device according to Embodiment 1 of the present invention.

Next, as shown in FIG. 4, the InP layer 5 and the InGaAs contact layer 7 are patterned by dry etching or wet etching down to the sacrifice layer 3 using an insulating film hard mask of SiO2 or the like to form a ridge upper part 8 with a desired ridge width in accordance with required characteristics. Next, as shown in FIG. 5, the sacrifice layer 3 is selectively removed by wet etching from the outermost surface layer 2a of the active layer 2 and the InP layer 5. Thus a ridge structure 9 having a ridge lower part 6 and a ridge upper part 8 above the ridge lower part 6 and having a larger width than the ridge lower part 6 is formed on the semiconductor substrate 1. As the ridge upper part 8 is wider than the ridge lower part 6, there are formed recesses 11 in the ridge structure 9 where the ridge lower part 6 is laterally set back from the ridge upper part 8, and a step 17 in the side face of the ridge structure 9. This step 17 creates a space 18 between the outermost surface layer 2a of the active layer 2 and the bottom surface 16 of the ridge upper part 8. The space 18 is a gap where no solid members such as semiconductors or insulators are present. With such a step 17 including the space 18 in the side face, the mechanical strength of the ridge structure 9 is low.

Figure 6:
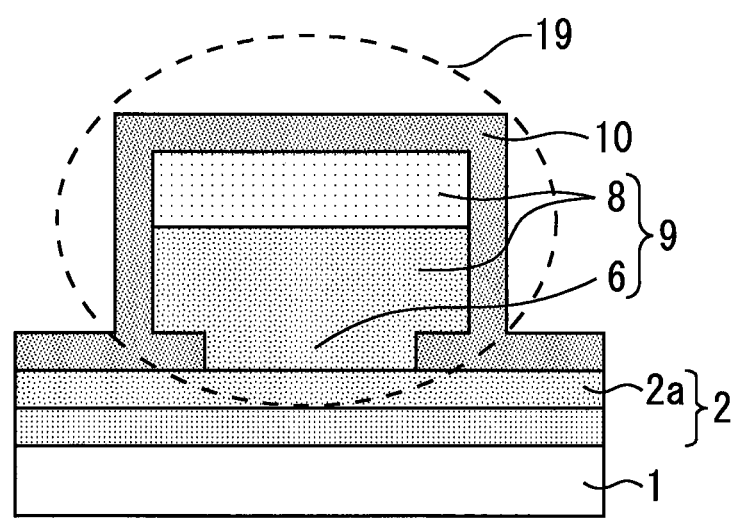
FIG. 6 is a cross-sectional view illustrating a method for manufacturing an optical semiconductor device according to Embodiment 1 of the present invention.
Figure 7:
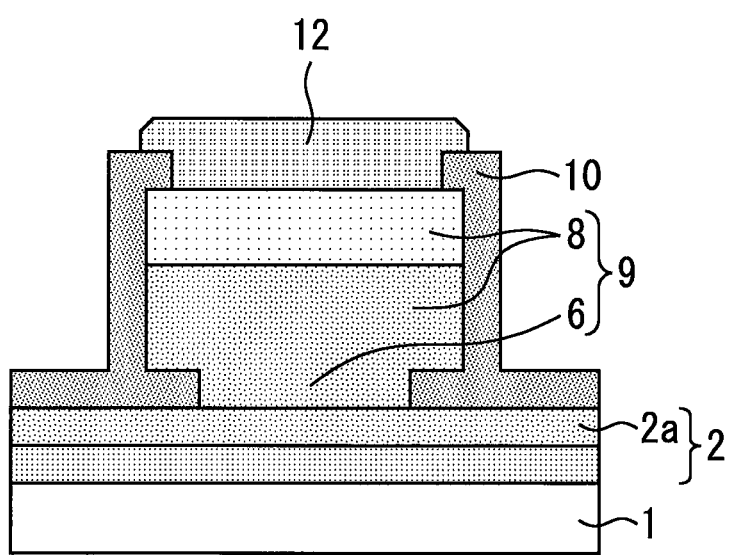
FIG. 7 is a cross-sectional view illustrating a method for manufacturing an optical semiconductor device according to Embodiment 1 of the present invention.

Next, as shown in FIG. 6, an insulating film 10 is formed on the entire surface by an atomic layer deposition (ALD) method, whereby the insulating film 10 completely fills the recesses 11 in the ridge structure 9 that are formed by the setting back of the ridge lower part 6 from the ridge upper part 8 due to the difference in width between the ridge upper part 8 and the ridge lower part 6. Lastly, as shown in FIG. 7, part of the insulating film 10 is removed by etching on the upper surface of the ridge structure 9 to form an electrode 12.

Figure 8A:
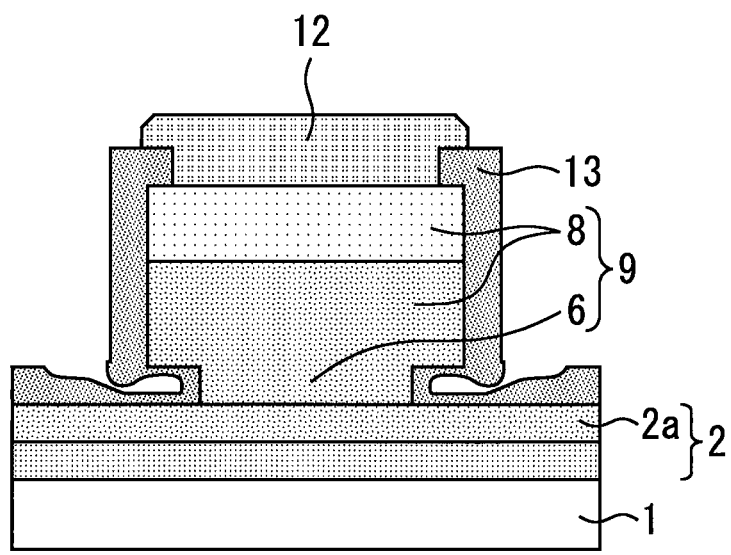
FIGS. 8A and 8B are cross-sectional views illustrating an optical semiconductor device according to the comparative example.
Figure 8B:
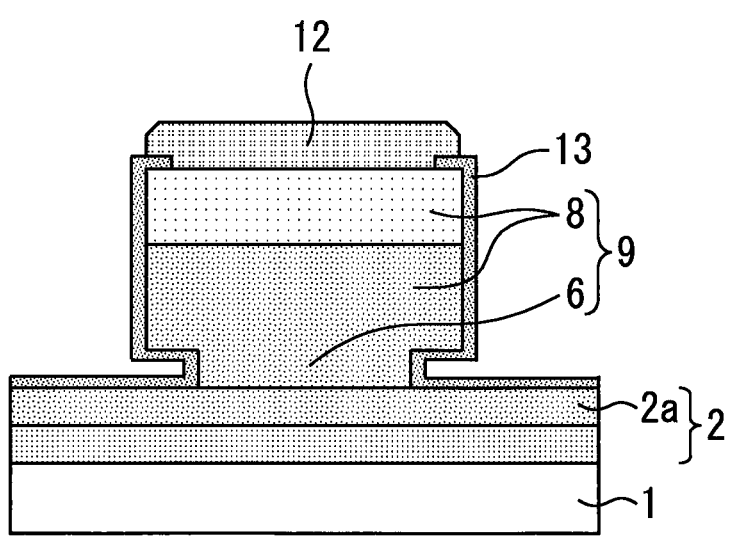

The effects of this embodiment will now be explained in comparison to a comparative example. FIGS. 8A and 8B are cross-sectional views illustrating an optical semiconductor device according to the comparative example. FIG. 8A shows insufficient coverage with an insulating film 13 as a result of forming the insulating film 13 by a sputtering or plasma CVD method, wherein the insulating film 13 fails to completely fill the recesses 11 in the ridge structure 9. The consequent problem is that the ridge structure 9 is susceptible to changes in the external environment such as temperature, aging, and mechanical stress applied during assembly. According to the embodiment, on the other hand, the recesses 11 in the ridge structure 9 are completely filled with the insulating film 10 formed by an ALD method. Thus the mechanical strength of the ridge structure 9 can be enhanced. Note, merely forming the insulating film 13 by the ALD method such that the recesses 11 in the ridge structure 9 are not completely filled as shown in FIG. 8B does not increase the mechanical strength of the ridge structure 9. This embodiment features not only the use of the ALD method but complete filling of recesses 11 in the ridge structure 9 by the use of the ALD method as shown in FIG. 6 so as to eliminate the step 17 in the side face of the ridge structure 9 and the space 18 between the outermost surface layer 2a of the active layer 2 and the bottom surface 16 of the ridge upper part 8, so that a protrusion 19 is formed from the semiconductor substrate 1, the ridge structure 9, and the insulating film 13 without any step in the side face, whereby the mechanical strength of the ridge structure 9 can be increased. With the ridge lower part 6 having a height of no greater than 300 nm and a lateral width of no greater than 3 μm, the recesses 11 in the ridge structure 9 can be completely filled with the insulating film 10, whereby a high response speed can also be achieved.

Embodiment 2

Figure 9:
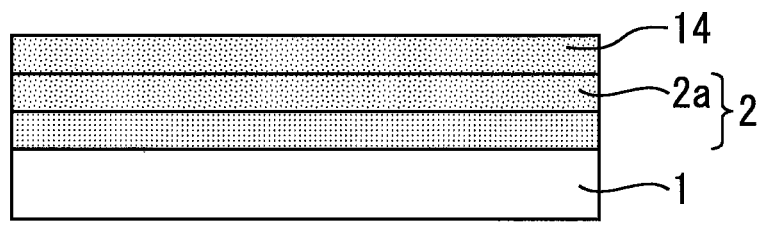
FIG. 9 is a cross-sectional view illustrating a method for manufacturing an optical semiconductor device according to Embodiment 2 of the present invention.

FIG. 9 to FIG. 16 are cross-sectional views illustrating a method for manufacturing an optical semiconductor device according to Embodiment 2 of the present invention. First, as shown in FIG. 9, an active layer 2 is formed on a semiconductor substrate 1. An outermost surface layer 2a of the active layer 2 is an InP layer. An InP layer 14 is formed on the active layer 2.

Figure 10:
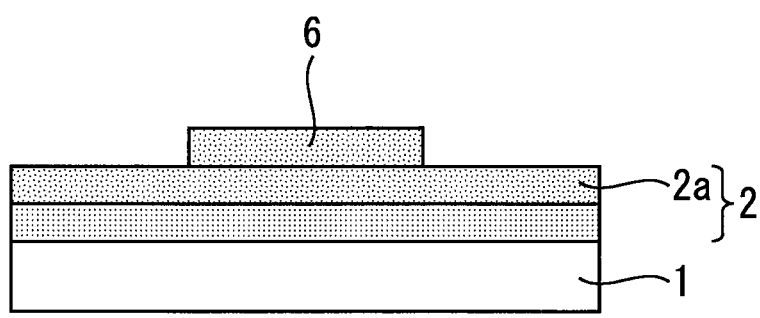
FIG. 10 is a cross-sectional view illustrating a method for manufacturing an optical semiconductor device according to Embodiment 2 of the present invention.

Next, as shown in FIG. 10, the InP layer 14 is patterned by dry etching to form a ridge lower part 6. By forming the outermost surface layer 2a of the active layer 2 from InGaAsP, the ridge lower part 6 can be formed only by wet etching, or a combination of dry etching and wet etching.

Figure 11:
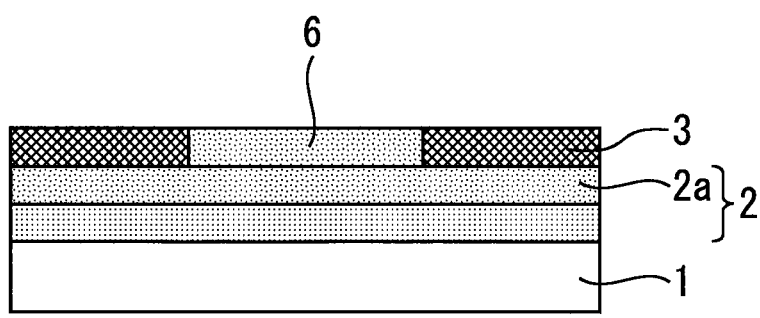
FIG. 11 is a cross-sectional view illustrating a method for manufacturing an optical semiconductor device according to Embodiment 2 of the present invention.

Next, as shown in FIG. 11, a sacrifice layer 3 made of a different material from those of the outermost surface layer 2a of the active layer 2 and the InP layer 14 is formed around the ridge lower part 6 up to a height such as not to cover the upper surface of the ridge lower part 6. The sacrifice layer 3 is required to have an etching selectivity to InP, and may be an InGaAsP layer, for example.

Figure 12:
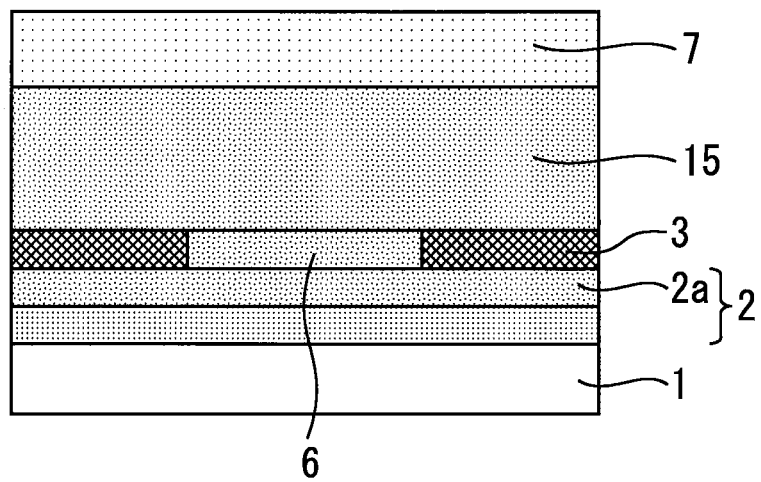
FIG. 12 is a cross-sectional view illustrating a method for manufacturing an optical semiconductor device according to Embodiment 2 of the present invention.

Next, as shown in FIG. 12, an InP layer 15 made of a different material from that of the sacrifice layer 3 is formed on the ridge lower part 6 and the sacrifice layer 3. An InGaAs contact layer 7 is then formed on the InP layer 15. A thin InP layer may be formed on the InGaAs contact layer 7 as a cap layer.

Figure 13:
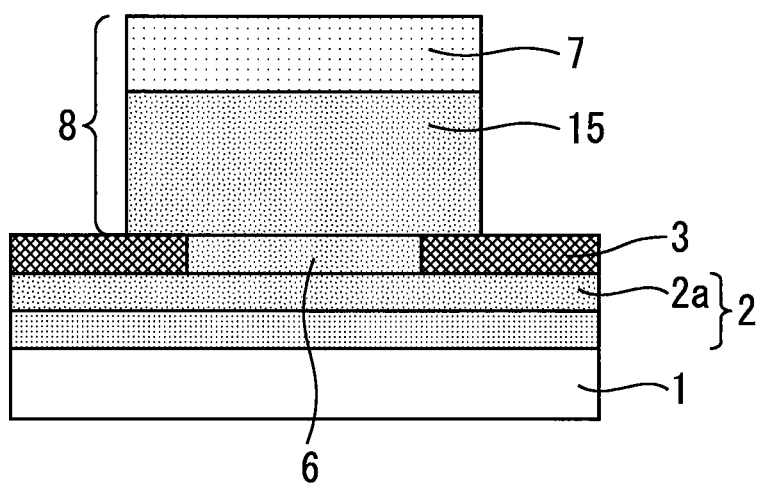
FIG. 13 is a cross-sectional view illustrating a method for manufacturing an optical semiconductor device according to Embodiment 2 of the present invention.

Next, as shown in FIG. 13, the InP layer 15 and the InGaAs contact layer 7 are patterned by dry etching or wet etching down to the sacrifice layer 3 using an insulating film hard mask of $SiO_2$ or the like to form a ridge upper part 8 with a desired ridge width in accordance with required characteristics.

Figure 14:
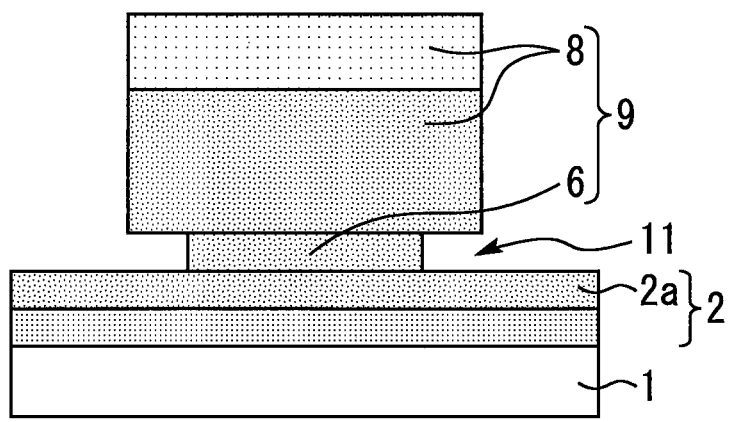
FIG. 14 is a cross-sectional view illustrating a method for manufacturing an optical semiconductor device according to Embodiment 2 of the present invention.
Figure 15:
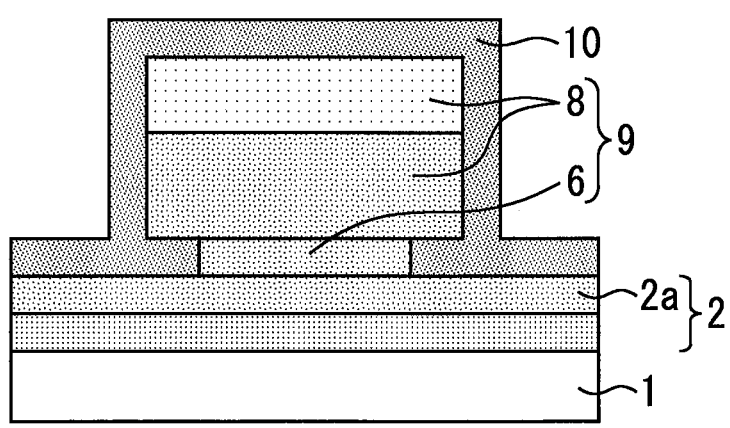
FIG. 15 is a cross-sectional view illustrating a method for manufacturing an optical semiconductor device according to Embodiment 2 of the present invention.
Figure 16:
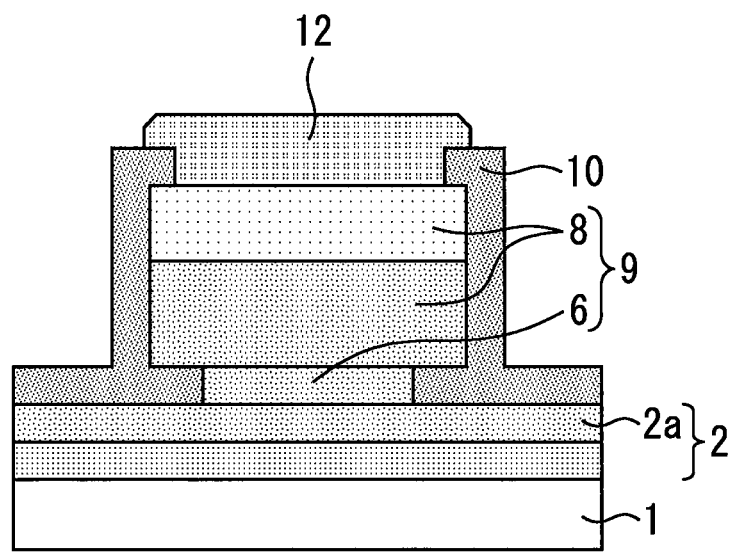
FIG. 16 is a cross-sectional view illustrating a method for manufacturing an optical semiconductor device according to Embodiment 2 of the present invention.

Next, as shown in FIG. 14, the sacrifice layer 3 is selectively removed by wet etching from the outermost surface layer 2a of the active layer 2 and the hiP layers 14 and 15. Next, as shown in FIG. 15, an insulating film 10 is formed on the entire surface by an ALD method to completely fill the recesses 11 in the ridge structure 9 with the insulating film 10. Lastly, as shown in FIG. 16, part of the insulating film 10 is removed by etching on the upper surface of the ridge structure 9 to form an electrode 12.

Also in this embodiment, as with Embodiment 1, the mechanical strength of the ridge structure 9 can be enhanced by completely filling the recesses 11 in the ridge structure 9 with the insulating film 10 using an ALD method.

In Embodiments 1 and 2, as long as the recesses 11 in the ridge structure 9 are completely filled with the insulating film 10 by the ALD method, another insulating film may be formed using a sputtering or plasma CVD method. While the ridge lower part 6 and the ridge upper part 8 have vertical ridge shapes so that the ridge structure 9 has a T-shape, the ridge structure 9 is not limited to the T-shape and may have a reverse mesa-like shape or Y-shape. The optical semiconductor device according to the embodiments is an optical integrated device such as a DFB laser, a modulator laser, for example, but the application of the present invention is not limited to these.

REFERENCE SIGNS LIST 1 semiconductor substrate; 2 active layer; 2a outermost surface layer; 3 sacrifice layer; 4 aperture; 5 InP layer (semiconductor layer); 6 ridge lower part; 8 ridge upper part; 9 ridge structure; 11 recess; 14 InP layer (first semiconductor layer); 15 InP layer (second semiconductor layer); 16 bottom surface of ridge upper part; 17 step; 18 space; 19 protrusion

The invention claimed is:

1. A method for manufacturing an optical semiconductor device comprising:
    forming a ridge structure having a ridge lower part, a ridge upper part above the ridge lower part and having a larger width than the ridge lower part, on a semiconductor substrate; and
    completely filling a recess of the ridge structure, where the ridge lower part is laterally set back from the ridge upper part due to a difference in width between the ridge upper part and the ridge lower part, with an insulating film by an atomic layer deposition method to form a rectangular protrusion from the semiconductor substrate, the ridge structure, and the insulating film without any step in a side face of the rectangular protrusion, the insulating film extending directly from the rectangular protrusion in a direction parallel to the substrate, the insulating film having a first exposed surface where the insulating film extends along a side face of the rectangular protrusion and a second exposed surface where the insulating film extends along the substrate.

2. The method for manufacturing an optical semiconductor device according to claim 1, further comprising:
    forming an active layer on the semiconductor substrate;
    forming a sacrifice layer made of a different material from that of an outermost surface layer of the active layer on the active layer;
    removing part of the sacrifice layer to form an aperture;
    forming a semiconductor layer made of a different material from that of the sacrifice layer on the active layer and the sacrifice layer to form the ridge lower part inside the aperture;
    patterning the semiconductor layer to form the ridge upper part; and
    after forming the ridge upper part and before forming the insulating film, selectively etching and removing the sacrifice layer from the outermost surface layer of the active layer and the semiconductor layer.

3. The method for manufacturing an optical semiconductor device according to claim 1, further comprising:
    forming an active layer on the semiconductor substrate;
    forming a first semiconductor layer on the active layer;
    patterning the first semiconductor layer to form the ridge lower part;
    forming a sacrifice layer made of a different material from those of an outermost surface layer of the active layer and the first semiconductor layer around the ridge lower part up to a height such as not to cover an upper surface of the ridge lower part;
    forming a second semiconductor layer made of a different material from that of the sacrifice layer on the ridge lower part and the sacrifice layer;
    patterning the second semiconductor layer to form the ridge upper part; and
    after forming the ridge upper part and before forming the insulating film, selectively etching and removing the sacrifice layer from the outermost surface layer of the active layer and the first and second semiconductor layers.

4. The method for manufacturing an optical semiconductor device according to claim 2, wherein materials of the outermost surface layer of the active layer, the ridge lower part and the ridge upper part are InP, and
    a material of the sacrifice layer is InGaAsP.

5. The method for manufacturing an optical semiconductor device according to claim 1, wherein the ridge lower part and the ridge upper part have vertical ridge shapes, and
    the ridge structure has a T-shape.

6. The method for manufacturing an optical semiconductor device according to claim 1, wherein the optical semiconductor device is a DFB laser.

7. The method for manufacturing an optical semiconductor device according to claim 1, wherein the optical semiconductor device is an optical integrated device.

8. The method for manufacturing an optical semiconductor device according to claim 3, wherein materials of the outermost surface layer of the active layer, the ridge lower part and the ridge upper part are InP, and
    a material of the sacrifice layer is InGaAsP.

9. The method for manufacturing an optical semiconductor device according to claim 2, wherein the ridge lower part and the ridge upper part have vertical ridge shapes, and
    the ridge structure has a T-shape.

10. The method for manufacturing an optical semiconductor device according to claim 2, wherein the optical semiconductor device is a DFB laser.

11. The method for manufacturing an optical semiconductor device according to claim 2, wherein the optical semiconductor device is an optical integrated device.

12. The method for manufacturing an optical semiconductor device according to claim 3, wherein the ridge lower part and the ridge upper part have vertical ridge shapes, and
    the ridge structure has a T-shape.

13. The method for manufacturing an optical semiconductor device according to claim 3, wherein the optical semiconductor device is a DFB laser.

14. The method for manufacturing an optical semiconductor device according to claim 3, wherein the optical semiconductor device is an optical integrated device.

15. The method for manufacturing an optical semiconductor device according to claim 4, wherein the ridge lower part and the ridge upper part have vertical ridge shapes, and
    the ridge structure has a T-shape.

16. The method for manufacturing an optical semiconductor device according to claim 4, wherein the optical semiconductor device is a DFB laser.

17. The method for manufacturing an optical semiconductor device according to claim 4, wherein the optical semiconductor device is an optical integrated device.

18. The method for manufacturing an optical semiconductor device according to claim 8, wherein the ridge lower part and the ridge upper part have vertical ridge shapes, and
    the ridge structure has a T-shape.

19. The method for manufacturing an optical semiconductor device according to claim 8, wherein the optical semiconductor device is a DFB laser.

20. The method for manufacturing an optical semiconductor device according to claim 8, wherein the optical semiconductor device is an optical integrated device.

* * * * *